United States Patent
Biegelsen et al.

(10) Patent No.: US 6,802,927 B2
(45) Date of Patent: Oct. 12, 2004

(54) METHOD FOR CUTTING A MEMBER TO FORM A DESIRED STRUCTURE

(75) Inventors: David Kalman Biegelsen, Portola Valley, CA (US); Lars Erik Swartz, Sunnyvale, CA (US)

(73) Assignee: Xerox Corporation, Stamford, CT (US)

(*) Notice: Subject to any disclaimer, the term of this patent is extended or adjusted under 35 U.S.C. 154(b) by 227 days.

(21) Appl. No.: 10/033,958

(22) Filed: Oct. 22, 2001

(65) Prior Publication Data

US 2003/0075266 A1 Apr. 24, 2003

(51) Int. Cl.[7] ............................................. B32B 31/00
(52) U.S. Cl. ................... 156/248; 156/247; 156/272.8; 156/257; 156/268; 219/121.67; 219/121.68; 219/121.69; 219/121.72; 219/121.7; 219/121.73
(58) Field of Search ..................... 219/121.67, 121.68, 219/121.69, 121.72, 121.7, 121.73; 83/565; 156/247, 248, 249, 252, 253, 257, 267, 268, 272.8, 344

(56) References Cited

U.S. PATENT DOCUMENTS

| | | | | |
|---|---|---|---|---|
| 3,617,683 A | * | 11/1971 | Beresford | ............... 219/121 L |
| 4,262,186 A | * | 4/1981 | Provancher | ........... 219/121 LH |
| 4,458,133 A | * | 7/1984 | Macken | ...................... 219/121 |
| 5,504,301 A | | 4/1996 | Eveland | |
| 6,210,514 B1 | | 4/2001 | Cheung et al. | ............. 156/241 |
| 6,216,354 B1 | | 4/2001 | Carbone | |

OTHER PUBLICATIONS

European Search Report, Application No. EP 02 25 7216, The Hague, Feb. 4, 2004, Examiner D. Aran.

* cited by examiner

*Primary Examiner*—Linda L Gray
(74) *Attorney, Agent, or Firm*—Fay, Sharpe, Fagan, Minnich & McKee, LLP

(57) ABSTRACT

A method and apparatus for improved cutting of an object is provided. The object can take the form of many different structures including thin formations that require cutting precision, support, and dimensional control. In accordance with one example embodiment of the present invention, the method of cutting a member uses a laser and begins with the step of providing a template removably adhered to the member. The laser then projects through the template, without intersecting with the template, to cut the member and manufacture the desired formation. The laser does not intersect with, and therefore does not cut, the template structure and cause excess laser cutting dust.

9 Claims, 10 Drawing Sheets

METHOD FOR CUTTING A MEMBER TO FORM A DESIRED STRUCTURE

FIELD OF THE INVENTION

The present invention relates to an improved method for cutting, and more particularly to the production of structures by laser cutting layers, or members of film or thin film structures.

BACKGROUND OF THE INVENTION

Many different structures often require the use of a laser to cut through a membrane, layer, or film, to form a desired formation. One example field that requires the precision and other features of a laser for cutting and forming these formations is the field of microelectromechanical or microelectronic devices. Such devices often require cutting and transporting a delicate thin film structure from a source substrate to a new position on a target substrate. As such, a number of different procedures have been developed for cutting and transporting the thin film formations. For example, low tack adhesives or methods utilizing electrostatic forces have been developed to enable the formation and transportation of the thin film formations.

One known method for machining and attaching a thin film formation is taught in U.S. Pat. No. 6,210,514 to Cheung et al., which is incorporated herein by reference. The process of separating a thin film formation from the layer from which it has been cut, or from an adhesive transportation layer, can often deform, alter, stress, or destroy the thin film structure undesirably. Defects ranging from slight deformation or improper positioning, to major tears or structural deficiencies, can ultimately lead to the failure of the microelectromechanical device into which the thin film formations are placed.

The method of machining an attachment as described in the '514 patent can be summarized as follows. A thin film is affixed to a low tack polymeric membrane. While positioned on the polymeric membrane, the thin film is machined to define a thin film structure. This thin film structure (or array of thin film structures) is then separated from the polymeric membrane in a mostly deformation-free state. In this manner, various target substrates, including glass, silicon, or printed circuit boards, can be equipped with mostly stress-free thin film structures suitable for use in a wide variety of microelectromechanical or microelectronic devices.

However, structures that are cut through the low tack polymeric membrane still have significant stresses induced by edge contamination resulting from the molten polymeric material, as well as from plastic deformations that arise during delamination of the low tack polymeric membrane from the thin film structure. In addition, a collection of dust results when the laser cuts through the low tack polymeric membrane. This laser cutting dust is a source of additional contamination for the thin film and the microelectromechanical device into which the thin film ultimately mounts. The collection of dust on the thin film can have adverse affects on the functionality of the microelectromechanical or microelectronic devices. Further, once the laser cuts the low tack polymeric membrane during the manufacture of the thin film formation, it is not possible to reuse the low tack polymeric membrane to cut additional thin film structures to form like formations. Reusability would promote reduced costs and improved efficiency.

SUMMARY OF THE INVENTION

There is a need in the art for an improved laser cutting method and corresponding apparatus, for manufacturing structures such as thin formations that require laser cutting precision. The present invention is directed toward further solutions to address this need.

In accordance with one example embodiment of the present invention, a method of cutting a member with a laser begins with the step of providing the member. A template is then provided, and adhered to the member. The laser then projects through the template, without intersecting with the template, to cut the member and manufacture the desired formation. The laser does not intersect with, and therefore does not cut, the template structure and cause excess laser cutting dust.

A member, according to one aspect of the present invention, can be in the form of a film having multiple layers. One layer can be a metal layer and another layer can be a polymer layer. For example, the metal layer can be formed of aluminum and the polymer layer can be formed of polyester.

According to another aspect of the present invention, the step of adhering the member to the template can include removably attaching the template having low tack properties to a surface of the member through compression.

According to still another aspect of the present invention, the step of projecting the laser through the template includes directing the laser to pass through the template, without cutting the template, to cut through the member in a pattern corresponding to the template.

In accordance with one embodiment of the present invention, the method further includes the step of transferring the member formations to a removed location. The invention can further include the step of removing the template from the member in a manner such that the template is reusable.

In accordance with still another embodiment of the present invention, a method of cutting a member with a laser is provided. The method includes providing the member, a template, and a base. The member is sandwiched between the base and the template. A laser then projects through the template, without intersecting the template, to cut the member and form one or more member formations.

In accordance with still another embodiment of the present invention, an assemblage includes a member and a template removably adhering to the member. The template is suitable for accommodating a laser in cutting the member.

According to one aspect of the present invention, the member is a film. The film can be formed of multiple layers, such as a metal layer and a polymer layer. The metal layer can be aluminum and the polymer layer can be polyester.

According to another aspect of the present invention, the template can include a layer having a predefined cut out section suitable for accommodating the cutting of the member by the laser.

According to still another aspect of the present invention, the template can have low tack properties and be removably attached to a surface of the member through compression. The template can further be reusable after being removed from the member.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

Figure 1:
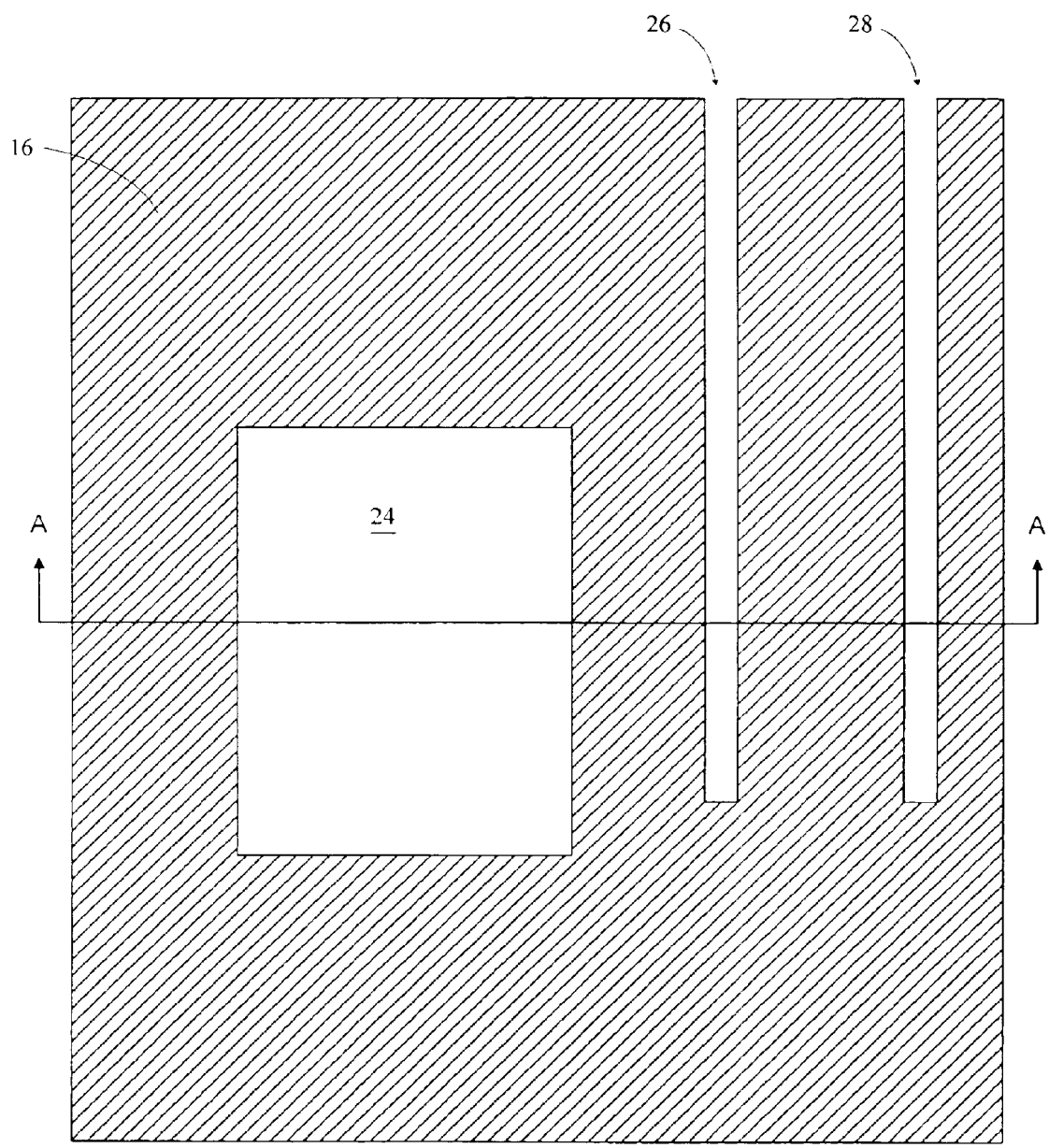
FIG. 1 is a polymeric member according to one aspect of the present invention.

An illustrative embodiment of the present invention relates to an improved method and apparatus for cutting a member with a laser. In accordance with the method of the present invention, the member, often in the form of a film or thin film, is affixed to a template. The template includes a plurality of apertures or patterns generally in the shape of desired formations to-be-cut into the member. The template serves to support the member, especially a thin film member that requires additional support, and allows a laser to pass through the apertures of the template to directly cut the member without cutting the template layer. The support provided by the template reduces the stress on the member, and more reliably holds the member in place prior to, and during, cutting. In addition, the template provides access for the laser such that excess laser dust particles do not result from having to cut through the template layer in addition to the member. The reduced quantity of laser dust levels improves the overall quality of the resulting formations, and decreases the propensity of unwanted dust particles to interfere with the transfer and use of the member formations.

FIGS. 1 through 18, wherein like parts are designated by like reference numerals throughout, illustrate example embodiments of an improved laser cutting process and associated apparatus, according to the teachings of the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed, such as the size, shape, or type of elements or materials, in a manner still in keeping with the spirit and scope of the present invention.

FIG. 1 illustrates a polymeric member 16, according to the teachings of the present invention. The polymeric member 16 is utilized for descriptive purposes herein. One of ordinary skill in the art will appreciate that the member can be made of a number of other materials, such as metal with a thin silicone tack layer, or bare plastic where tacking is effected by electrostatic adhesion. The polymer member 16 includes a first cut-out 24, a second cut-out 26, and third cut-out 28. The polymeric member 16 can be formed from a number of different chemically inert polymeric materials. It is preferable for the polymeric member 16 to have low tack properties and be formed from, e.g., polysiloxanes, polyurethanes, urethanes, styrenes, olefinics, copolyesters, polyamides, or other melt processible rubber materials. Two suitable materials are known as SYLGARD 184, manufactured by Dow Corning Corp., and GEL-PAK, made by Vichem Corporation of Sunnyvale, Calif.

The first, second, and third representative cut-outs 24, 26, and 28, represent openings in a polymeric member 16 that enable a laser to pass through the polymeric member 16 without intersecting with, or cutting, the polymeric member 16. The laser passes through the polymeric member 16 to cut an object on an opposite side of the polymeric member 16, as will be discussed later herein.

It should be noted that FIGS. 2 through 15 herein are cross-sectional views of the polymeric member 16 (and some alternative forms and structures of the polymeric member 16) as viewed along the cross-section indicated by line A—A in FIG. 1.

Figure 2:
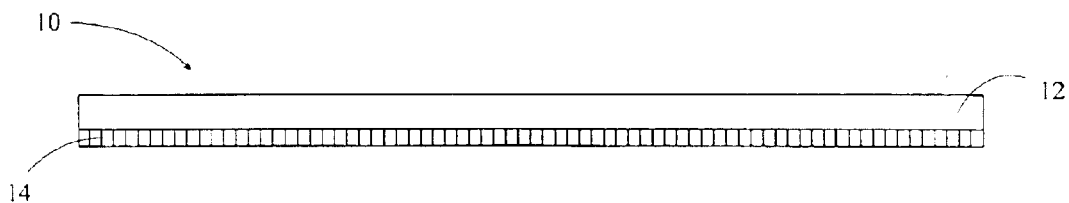
FIG. 2 is a cross-sectional view of the thin film assembly of FIG. 1 taken along line A—A.

A method of cutting as taught herein can be applied to a number of different layers, members, films, surfaces, objects, and the like. However, for purposes of clarity in describing the invention, an example of a thin film assembly 10, as illustrated in FIG. 2, will be utilized herein to describe the features and aspects of the present invention. The thin film assembly will be cut with a cutting element, in the form of a laser, however, other cutting elements can be utilized based in part on what is being cut. One of ordinary skill in the art will understand that the teachings of the present invention are applicable to objects other than thin film assemblies. In fact, the teachings of the present invention are applicable to a number of the identified structures in addition to other known objects requiring laser cutting, such as metal foils, textiles, tissue, biological membranes, and the like.

FIG. 2 illustrates the example thin film assembly 10. A metal layer 12 combines with a synthetic layer 14 to form the assembly 10. The synthetic layer can take the form of, e.g., MYLAR, which is available from E. I. Du Pont de Nemours and Company Corporation of Wilmington, Del. The synthetic layer 14 provides support and insulation for the thin metal layer 12 to reducing unwanted stresses on the metal layer 12. There are many other possible assemblies in the form of uniform or composite thin layers that can be handled in a same manner.

Figure 3:
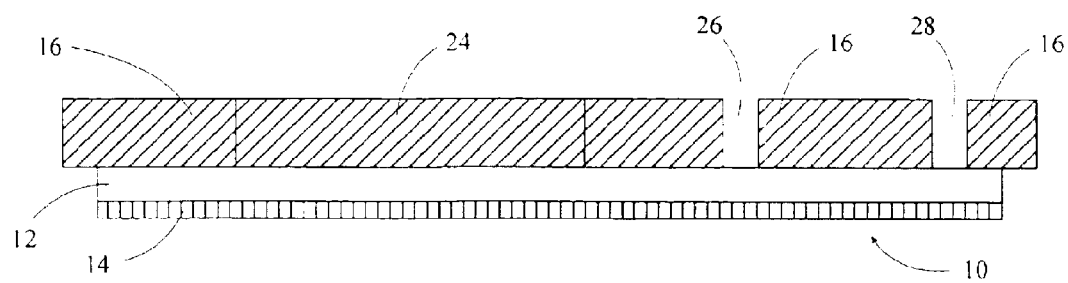
FIG. 3 is a cross-section of a thin film assembly and polymeric member according to one aspect of the present invention.

A cutting element in the form of a laser 36 (see FIG. 7) cuts the thin film assembly 10 into a desired number of pieces or formations. However, the stresses caused by the heat of the laser 36, and subsequent transportation of the formations, makes it useful to have a polymeric member 16 as illustrated in FIG. 3. The polymeric member 16 adheres to the top of the thin film assembly 10. The polymeric member 16 includes the first cut-out 24, the second cut-out 26, and the third cut-out 28. Each of the cut-outs 24, 26, and 28 corresponds to desired patterns or shapes for the cutting of the thin film assembly 10.

Figure 4:
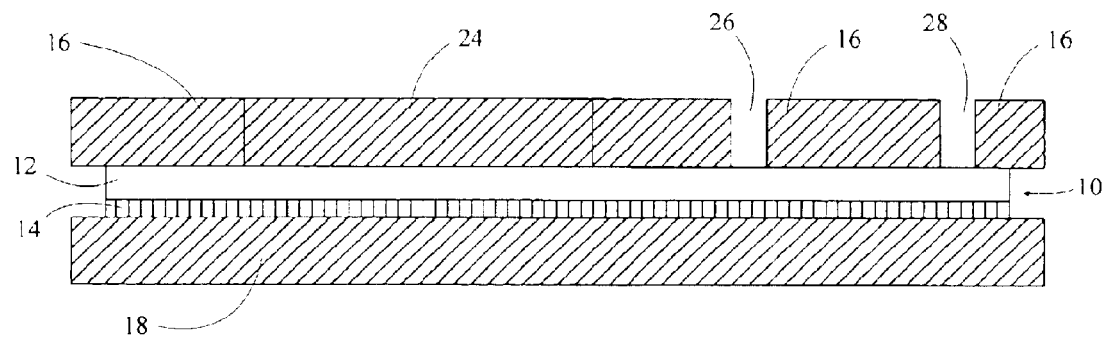
FIG. 4 is a cross-section of the thin film assembly and two polymeric members according to one aspect of the present invention.
Figure 5:
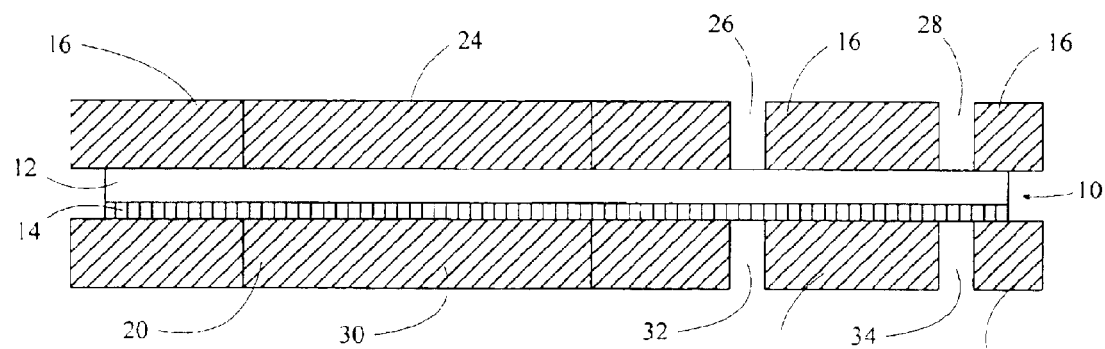
FIG. 5 is a cross-section of the thin film assembly and two polymeric members according to still another aspect of the present invention.

FIGS. 4 and 5 illustrate alternative variations for additional polymeric members in the form of a polymeric base 18 adhered to a bottom of the thin film assembly 10. In FIG. 4, the polymeric base 18 is a solid structure that provides additional support to ease the transportation of the thin film assembly 10 during the manufacturing process. The polymeric base 18 contains no apertures, and can have a low-tack surface for mildly adhering to the synthetic layer 14 of the thin film assembly 10.

FIG. 5 provides a second polymeric member 20 in addition to the original polymeric member 16. The thin film assembly 10 is sandwiched between the first polymeric member 16 and the second polymeric member 20. The second polymeric member 20 serves as a base structure similar to the polymeric base 18 of FIG. 4. Contrary to the structure of the solid polymeric member 18, the second polymeric member 20 includes a collection of apertures that pass through the second polymeric member 20. The collection of apertures, in the form of a fourth cut-out 30, a fifth cut-out 32, and a sixth cut-out 34, are in substantially the same shape and substantially the same location as the previously discussed first, second, and third cut-outs 24, 26, and 28. Thus, when the polymeric member 16 is placed in alignment with the second polymeric member 20, the first, second, and third cut-outs 24, 26, and 28 match substantially with the fourth, fifth, and sixth cut-outs 30, 32, and 34, to create apertures that pass completely through the combined polymeric member 16 and second polymeric member 20.

The cut-outs 24, 26, 28, 30, 32, and 34 allow a laser to pass completely through the thin film assembly 10 sandwiched between the polymeric members 16 and 20 without actually cutting, or making contact with, either polymeric member 16 or 20. Alternatively, in the assembly of FIG. 4, one must adjust the laser to stop cutting at the bottom edge of the thin film assembly 10, just as the laser passes through the thin film assembly 10 to kiss-cut the polymeric base 18. The tackiness of the two support layer polymeric membranes 16 and 20 is beneficially different so that in peeling the first membrane 16, the thin film remains adhered to the second membrane 20.

Figure 6:
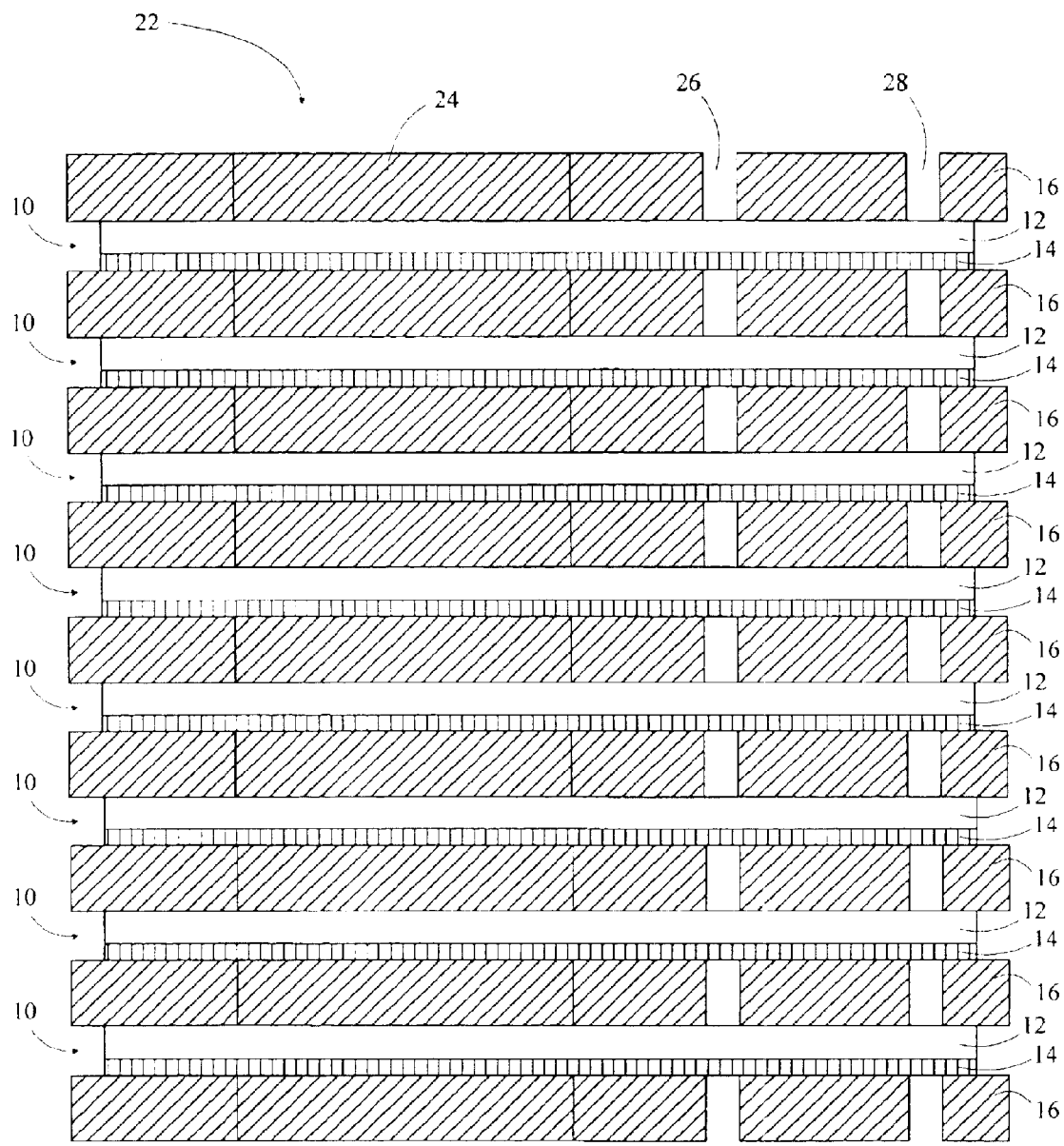
FIG. 6 is a cross-section of a stack assembly according to one aspect of the present invention.

It should be noted that the actual structure of a number of layers can vary as understood by one of ordinary skill in the art. For example, some layers could include different apertures or cut-outs than others. Some layers may be made of different materials from others. Some layers may be larger or smaller than other layers. FIG. 6 illustrates, for example, a stack of layers similar to the arrangement of FIG. 5. In FIG. 6, eight thin film assemblies 10 stack with polymeric members separating each of the thin film assemblies 10. This forms a stack 22 of polymeric members in combination with thin film assemblies. Each polymeric member includes a first cut-out 24, a second cut-out 26, and a third cut-out 28. Therefore, the laser passing through the stack 22 can pass through each of the apertures 24, 26, and 28 without cutting the polymeric member.

The overall arrangement and material selection can vary in ways too numerous to detail, but such arrangements and material selections fall within the spirit and scope of the present invention.

Figure 7:
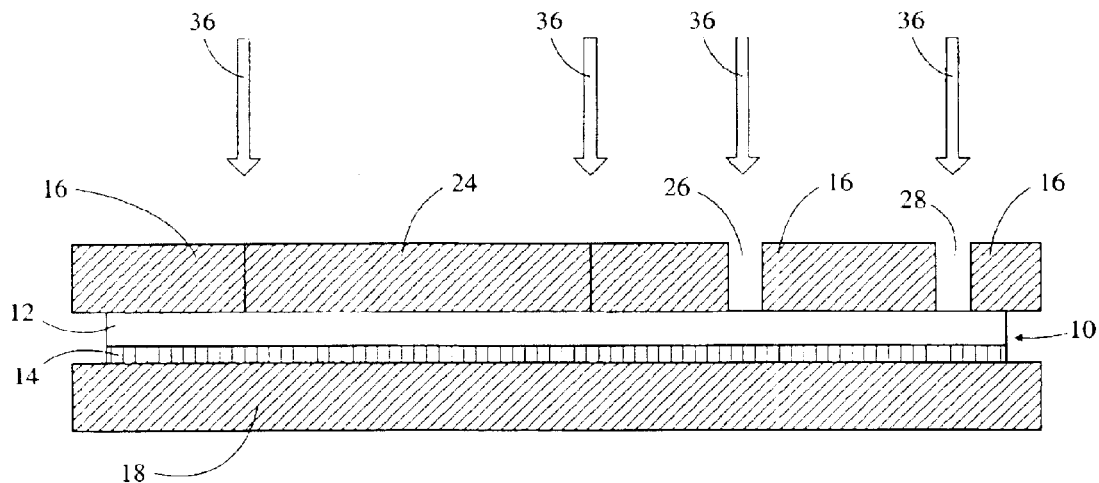
FIG. 7 is a cross-section of the thin film assembly sandwiched between two polymeric members according to a further aspect of the present invention.
Figure 8:
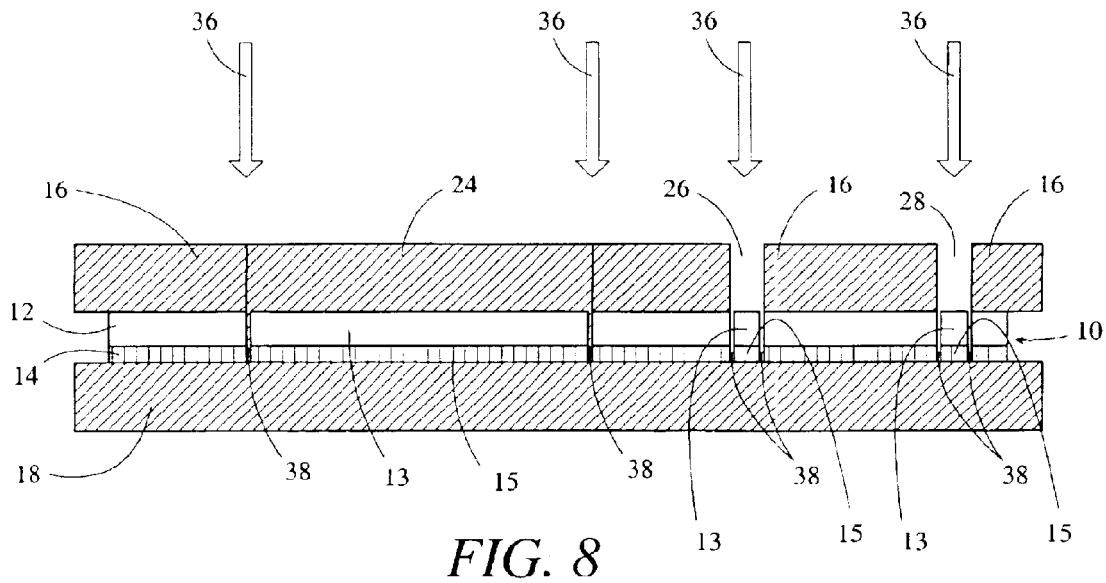
FIG. 8 is the assembly of FIG. 7 with laser incisions according to one aspect of the present invention.

FIGS. 7 and 8 illustrate a portion of the laser cutting process for cutting the thin film assembly 10 into desired formations. The laser 36 is directed as illustrated in a downward cutting direction along the perimeter of each of the first, second, and third cut-outs 24, 26, and 28. The laser 36 does not come into contact with the polymeric member 16 in FIG. 7, but it does kiss-cut the polymeric base 18 as it cuts through the metal layer 12 and the synthetic layer 14 of the thin film assembly 10. The existence of each of the cut-outs 24, 26, and 28 makes it possible for the laser to pass through the polymeric member 16, while the polymeric member 16 serves to provide the additional support to hold the thin film assembly 10 in place during the cutting process and during any subsequent transportation of the thin film assembly 10.

FIG. 8 illustrates the result after the laser 36 has cut through the thin film assembly 10. The laser passes through the first cut 24 and cuts through the metal layer 12 followed by the synthetic layer 14 and just to the top edge of the polymeric base 18. The resulting laser cuts 38 separate the thin film assembly 10 into the original metal layer 12 and the synthetic layer 14, and the new metal layer formation 13 in conjunction with the new synthetic layer formation 15. Each of the metal layer and synthetic layer formations 13 and 15 are shown as three separate pieces in FIG. 8 surrounded by laser cuts 38.

Figure 9:
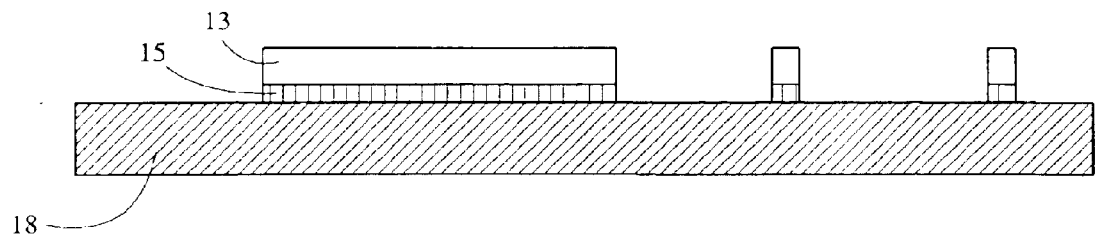
FIG. 9 is a cross-section of metal and polyester formations on an adhesive layer according another aspect of the present invention.

The next step in the manufacturing process is often to remove the unwanted metal layer 12 and synthetic layer 14 of the original thin film assembly 10, in addition to the polymeric member 16. FIG. 9 illustrates the result of the removal of each of these unwanted elements, leaving metal layer formation 13 and the synthetic layer formation 15 resting on top of the polymeric base 18. The low tack properties of the polymeric base 18 helps to hold the metal layer formation 13 and the synthetic layer formation 15 in place. As further described below, in the example embodiments illustrated in FIGS. 4, 5, and 6, the unwanted elements fall (or are blown) away when detached.

Figure 10:
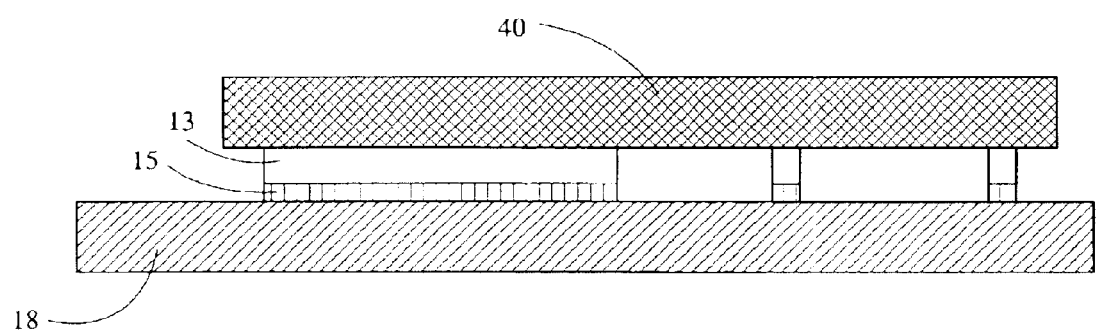
FIG. 10 is a cross-section of the assembly of FIG. 9 with an adhesive layer according to one aspect of the present invention.
Figure 11:
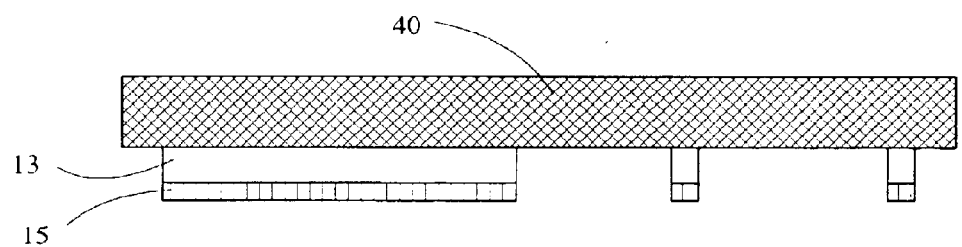
FIG. 11 is a cross-section of the adhesive layer of FIG. 10 bonded to the formations according one aspect of the present invention.
Figure 12:
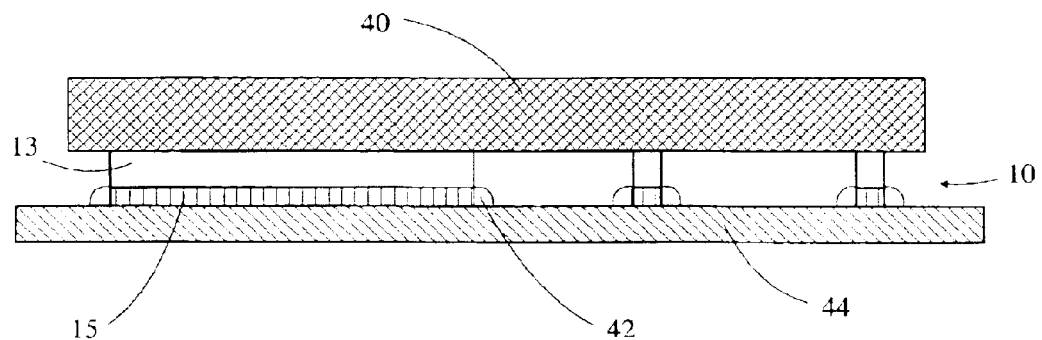
FIG. 12 is a cross-section of the adhesive and formations bonding to a board according to a further aspect of the present invention.

FIG. 10 illustrates a first step in the transportation process of the metal layer formation 13 and the synthetic layer formation 15 to a desired location. In this illustration, a transportation member 40, in the form of an adhesive member, is compressed onto the surface of the metal layer formation 13. The adhesive forces between the transportation member 40 are greater than those of the polymeric base 18. Therefore, as illustrated in FIG. 11, when the transportation member 40 raises, the synthetic layer formation 15 peels off the polymeric base 18 and is transported with the transportation member 40.

Figure 13:
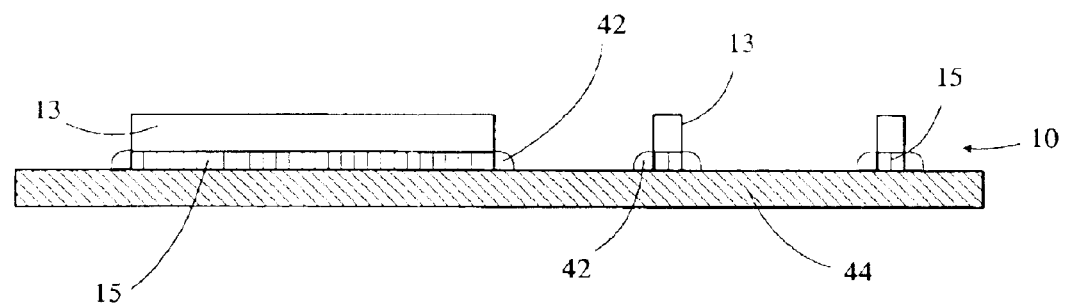
FIG. 13 is a cross-section of the formations mounted on the board according to the teachings of the present invention.

The transporting member 40 then drops the metal layer formation 13 and the synthetic layer formation 15 onto a desired location, such as a circuit board 44. Spot welds, or conducting adhesive, 42 bond the metal layer formation 13 and the synthetic layer formation 15 onto the board 44. Then, as illustrated in FIG. 13, the transporting member 40 peels off the metal layer formation 13 to leave the metal layer formation 13 and the synthetic layer formation 15 welded onto the board 44 in desired locations.

Figure 14:
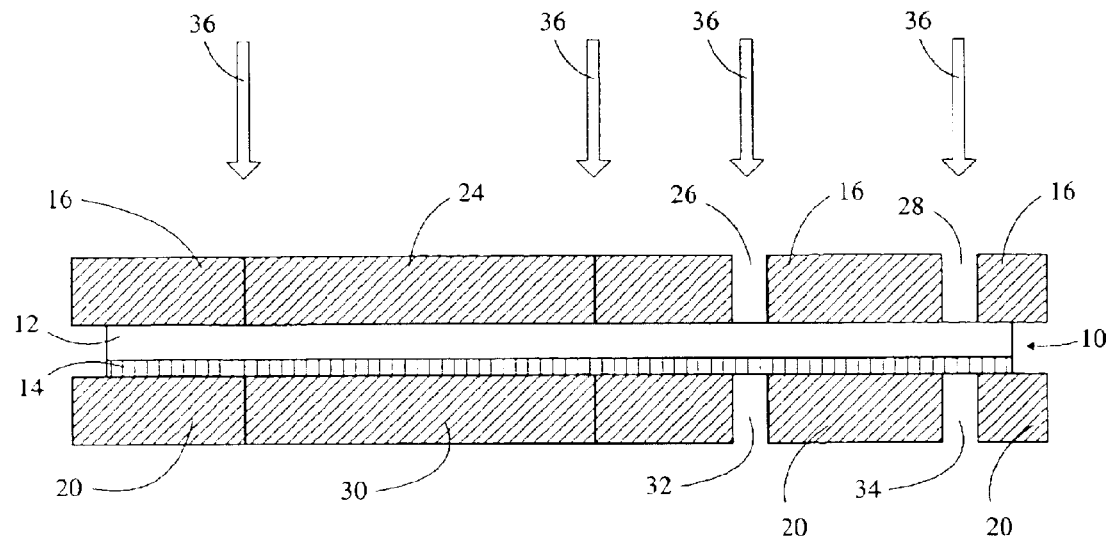
FIG. 14 is a cross-section of the thin film assembly sandwich between two polymeric members according to one aspect of the present invention.

FIG. 14 illustrates an alternative approach in accordance with the teachings of the present invention. The arrangement illustrated is similar to that of FIG. 5, wherein there is a polymeric member 16 having the first, second, and third cut-outs 24, 26, and 28, in addition to the second polymeric member 20 having the fourth, fifth, and sixth cut-outs 30, 32, and 34. The laser 36 makes the desired cuts to the assembly 10.

Figure 15:
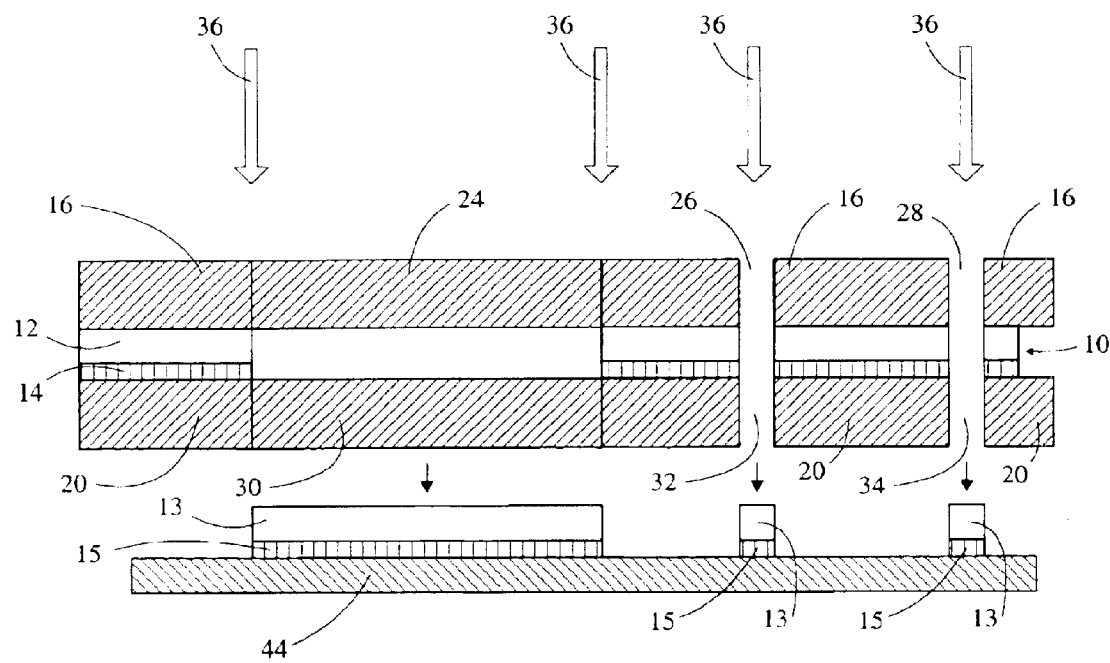
FIG. 15 is a cross-section of the assembly of FIG. 14 with formations having fallen out and come to rest on a board according to a further aspect of the present invention.

FIG. 15 illustrates the result of the laser cuts, wherein the metal layer formation 13 and the synthetic layer formation 15 drop from the metal layer 12 and the synthetic layer 14 location onto the board 44 after being cut by the laser 36. The apertures, or cutouts, of the templates in the form of the polymeric member 16 and the second polymeric member 20 allow the formed portions 13 and 15 of the metal layer 12 and the synthetic layer 14 to fall directly onto the board 44 without need for a transporting member 40. This arrangement greatly reduces the added stresses on the thin film caused by the transportation of the metal layer formation 13 and the synthetic layer formation 15 from the cutting location to the board 44. Once the metal layer formation 13 and the synthetic layer formation 15 have fallen to the board 44, additional welds 42 can mount the metal layer formation 13 and the synthetic layer formation 15 in place as previously depicted in FIG. 13.

Figure 16:
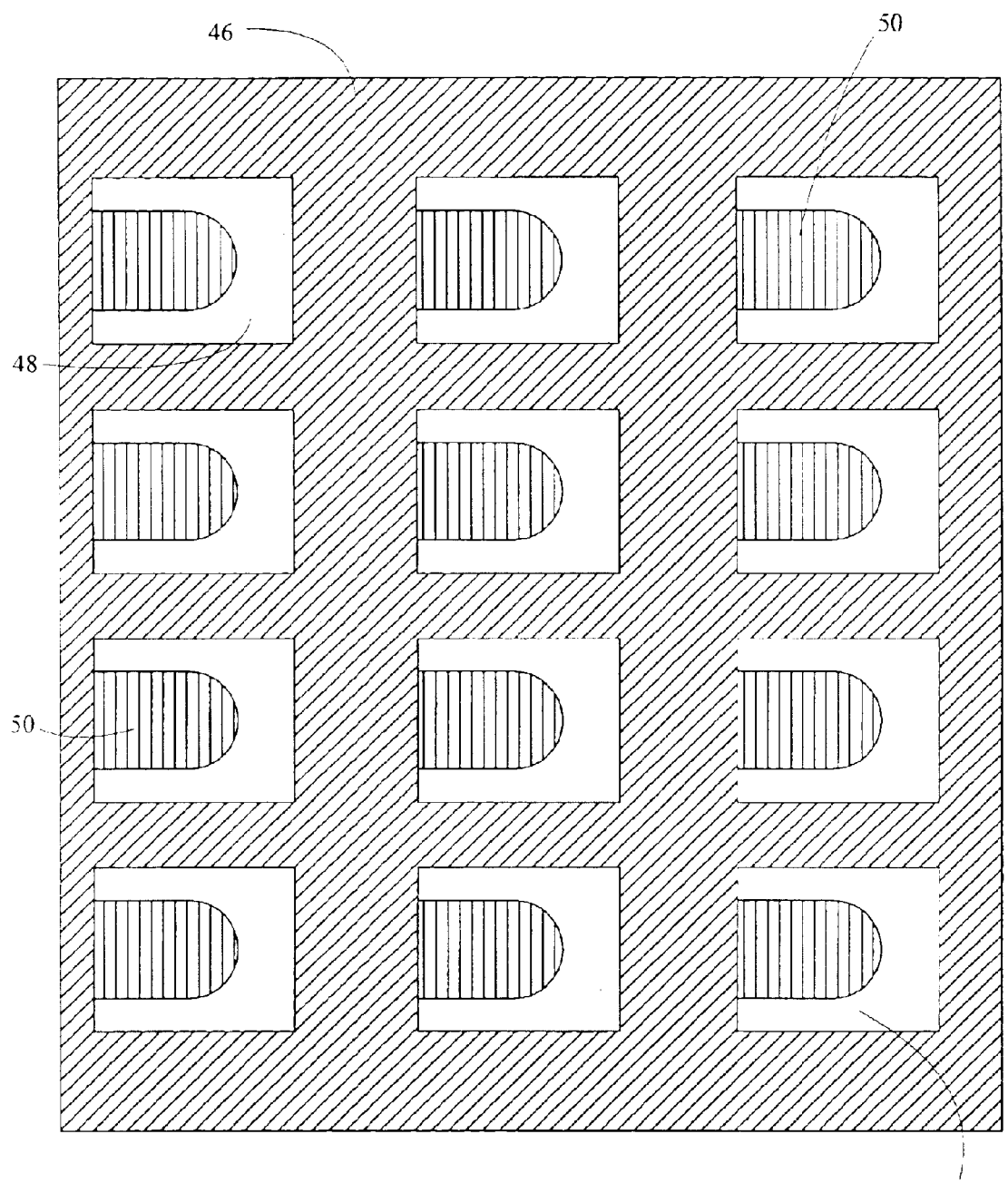
FIG. 16 is an alternative embodiment of a polymeric member according to further aspects of the present invention.

FIG. 16 illustrates still another embodiment of the present invention, wherein a polymeric member 46 includes a variety of different cut-outs 48 forming individual flaps 50. One of ordinary skill in the art will understand and appreciate that any number of different patterns, such as the one illustrated in FIG. 16 and the other figures herein, can be executed to result in a variety of different patterns and shapes for the thin film formations.

As understood by one of ordinary skill in the art, a number of different cutting tools can be utilized to cut the metal and synthetic layers 12 and 14, such as various mechanical, electrical, chemical, acoustical, or optical technologies. Some cutting techniques that can be used in conjunction with the templates of the polymeric members 16 as utilized herein can include stamping, die cutting, kiss-cutting, shearing, punching, breaking, forming, bending, forging, coming, and the like. Electrical technologies can further include electrical discharge machining using high frequency electric sparks. Chemical technologies can include chemical/mechanical polishing, electromechanical machining, electrolytic grinding, electrochemical arc machining, and acid electrolyte capillary drilling. Acoustic technologies can include ultrasonic machining, ultrasonic twist drilling, and other optical techniques such as laser cutting and drilling.

The present invention is particularly useful in conjunction with the laser cutting of fragile thin films and thin film assemblies. The thin films can be organic, inorganic, or composite. Thin films are generally extremely sensitive to different applied stresses. Actions such as handling and processing of the thin films often have the potential to cause wrinkling, creasing, scratching, stretching, contamination, and added residual stressing. Any of these different actions can permanently damage the thin film. Lamination of the thin film with the polymeric members greatly reduces the potential for this damage to occur.

The polymeric member as described herein can be made of any number of different materials for supporting the thin film assemblies. The polymeric member can be formed of various chemically inert polymeric materials, and can be used in cross link or gel form. Some embodiments may require the use of substantially transparent, or transparent, polymeric members. It is preferable to utilize low tack elastomeric membranes to aid the members in adhering to the films. However, bare plastic, metal, or layered structures, such as metal with a thin silicone layer, can be used as support members. The support members can be flexible and dimensionally stable, or non-stretchable.

Typically, the synthetic layer of the thin film assembly, which adds additional support to the metal layer, has a thickness on the order of 10 microns for supporting a metal layer having a thickness on the order of 0.1 microns. One of ordinary skill in the art will appreciate that in addition to polyester or aluminum thin films (which are most common), films based on other polymers including organic polymers such as polyethylene, polystyrene, polyamides, polyimides, and the like can be used. Some embodiments may additionally require the use of inorganic polymers such as silanes, or other silicones. Some microelectronic and microelectromechanical devices require the use of glass or polycrystalline films, silica wafers, or other crystalline materials commonly used in the semiconductor processing industry. Conductive metal films such as chromium, copper, tin, or gold can also be utilized in addition to a number of non-conductive dielectric films. Uniform thin metal foils without polymer layers, polymer films without metal foils, biological membranes, or the like, can be handled in a similar manner.

A typical laser utilized for the laser cutting of the thin film assemblies as described herein, can be a conventional 50 watts infrared carbon dioxide laser operated at about 10 watts with a 200 micron beam diameter near focus. During the laser cutting process, the thin film assembly is ablatively heated and evaporated to leave the laser cuts. Only the thin film assembly is cut in accordance with the present invention, not the template in the form of the polymeric member.

A suitable adhesive for forming the transporting member 40 can be Scotch 467 MP high performance adhesive manufactured by 3M Corporation. As previously mentioned, an assortment of particulates and dust that collects from the laser cutting of the thin film assembly represent a quality control issue. With the use of a polymeric member 16, and 20, the amount of material cut by the laser is significantly reduced, thereby significantly reducing the amount of leftover laser cutting dust. This greatly decreases the quality control issues surrounding contamination by particulate matter. The added support of the template in the form of the polymeric member 16, 20, also provides the required support for transporting the thin film assembly as desired.

In addition, the shape of the cut-outs in the templates or polymeric members 16, 20 can vary substantially. The shapes can closely mimic the desired formations, or they can be more generously portioned. The shapes can, for example, follow the exact lines of the desired formations, with a predetermined border. Alternatively, the shapes can simply provide openings in the general shape of, e.g., a square, rectangle, circle, and the like, with the laser cutting a more unique shape in the thin film within the boundaries of the template cut-outs.

Figure 17:
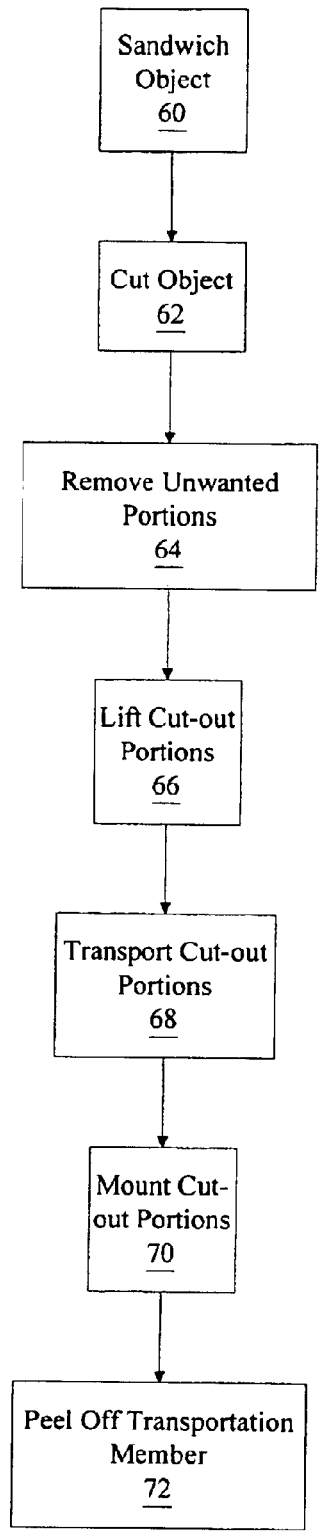
FIG. 17 is a flowchart illustrating a cutting process in accordance with one aspect of the present invention.
Figure 18:
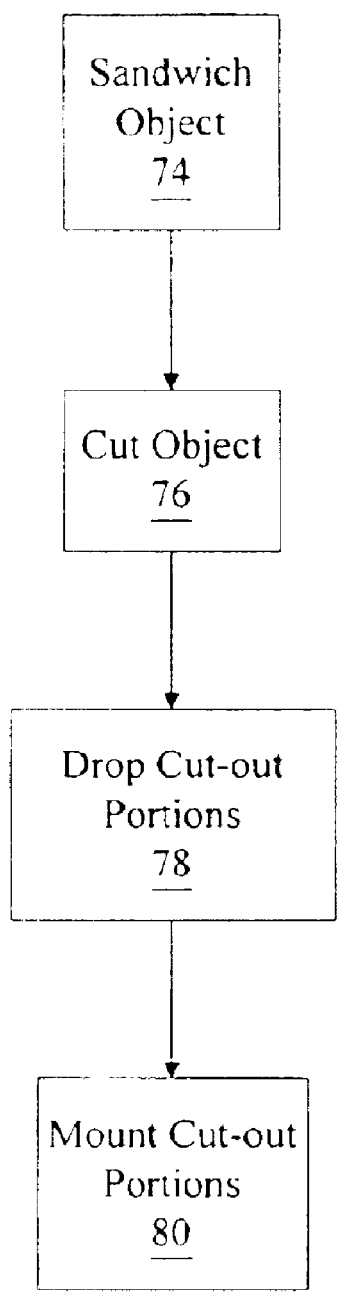
FIG. 18 is a flowchart illustrating an additional cutting process in accordance with another aspect of the present invention.

Referring to FIGS. 17 and 18, in operation, the object to-be-cut (e.g., the thin film assembly 10) is sandwiched between a pre-cut template (in the form of, e.g., polymeric member 16) and a base member (in the form of, e.g., polymeric base 18) (step 60). A cutting device, (e.g., a laser 36) passes through apertures in the template, cuts desired patterns or shapes in the thin film assembly 10, and kiss-cuts the base member (step 62). Unwanted portions of the template and the thin film assembly are removed (step 64). A transportation member, (e.g., an adhesive coated member) compresses against the cut-out portions of the thin film assembly, and lifts the portions off the base member (step 66). The transportation member moves the cut-out portions to a desired location (step 68) and lowers the cut-out portions to, e.g., a board. The cut-out portions are fixed to the board by, for example, a welding process (step 70), and the transportation member peels off the cut-out portions that are now mounted in place (step 72).

FIG. 18 illustrates an alternative method in accordance with the teachings of the present invention. First, the object is sandwiched between a template and a base containing the same cut-out sections as the template (as depicted in FIG. 14) (step 74). The cutting device passes through the apertures of the top template, and also through the apertures of the bottom base, while cutting the object in-between (step 76). The cut-out portions of the object drop to a board positioned below the thin film assembly (step 78), and the cut-out portions can be fixed to the board as desired (80).

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the present invention, and exclusive use of all modifications that come within the scope of the appended claims is reserved. It is intended that the present invention be limited only to the extent required by the appended claims and the applicable rules of law.

What is claimed is:

1. A method of cutting a thin film member, comprising the steps of:

adhering the member to a re-usable template having low-tack surfaces and pre-defined cut-out sections;

projecting a laser through the template, without intersecting the template;

cutting the member with the laser to form one or more member formations;

removing the template from the member, which carries off dust generated during the cutting of the member; and discarding portions of the member that are adhered to the template and maintaining portions cut-out from the thin film member corresponding to the open template portions.

2. The method according to claim 1, wherein the member comprises a multi-layered film having a metal layer and a polymer layer.

3. The method according to claim 2, wherein the polymer layer of the multi-layered film adds additional support to the metal layer, has a thickness of 10 microns for supporting the metal layer having a thickness of 0.1 microns.

4. The method according to claim 1, wherein the step of providing the template increases dimensional stability, and lowers accumulation of cutting debris, excess heating, and detachment stress.

5. The method according to claim 1, further comprising the step of sandwiching each thin film member with the templates on each side when there is one or more members to be cut.

6. The method according to claim 5, wherein the step of sandwiching the member with the templates comprises having a beneficially different tackiness value between the templates, so that in peeling the template off, the thin film member remains adhered to the other template.

7. The method according to claim 1, further comprising the step of providing a base having a low tack surface and a solid layer for supporting the member, on the side opposite the template, and the one or more member formations.

8. The method according to claim 7, wherein the step of providing the base comprises supplying a re-usable layer having pre-defined cut-out section.

9. The method according to claim 1, further comprising the step of transferring the member formations adhered to the template, which were formed by the cutting element, to a separate location.

* * * * *

UNITED STATES PATENT AND TRADEMARK OFFICE
CERTIFICATE OF CORRECTION

PATENT NO. : 6,802,927 B2 Page 1 of 1
APPLICATION NO. : 10/033958
DATED : October 12, 2004
INVENTOR(S) : David K Biegelsen et al.

It is certified that error appears in the above-identified patent and that said Letters Patent is hereby corrected as shown below:

Column 1, line 3, insert as a new paragraph:

This invention was made with Government support under DABT63-95-C-0025 awarded by ARPA. The Government has certain rights in this invention.

Signed and Sealed this

Twenty-seventh Day of May, 2008

JON W. DUDAS
*Director of the United States Patent and Trademark Office*